(12) United States Patent
Watanabe

(10) Patent No.: US 6,902,410 B2
(45) Date of Patent: Jun. 7, 2005

(54) CONTACT UNIT AND SOCKET FOR ELECTRICAL PARTS

(75) Inventor: Tsuyoshi Watanabe, Kawaguchi (JP)

(73) Assignee: Enplas Corporation, Saitama (JP)

( * ) Notice: Subject to any disclaimer, the term of this patent is extended or adjusted under 35 U.S.C. 154(b) by 0 days.

(21) Appl. No.: 10/616,728

(22) Filed: Jul. 10, 2003

(65) Prior Publication Data

US 2004/0053539 A1 Mar. 18, 2004

(30) Foreign Application Priority Data

Jul. 15, 2002 (JP) .......................................... 2002-206024
Jul. 15, 2002 (JP) .......................................... 2002-206025

(51) Int. Cl.[7] .............................................. H01R 12/22
(52) U.S. Cl. ........................................... 439/66; 439/73
(58) Field of Search .............................. 439/66, 71, 73, 439/75, 331; 361/764; 200/242

(56) References Cited

U.S. PATENT DOCUMENTS 4,412,113 A * 10/1983 Mitsugi et al. ............. 200/242
5,691,041 A * 11/1997 Frankeny et al. ............. 439/71
6,416,331 B1 * 7/2002 Shimizu ....................... 439/66
6,464,511 B1 * 10/2002 Watanabe et al. ............. 439/66
2001/0039128 A1 * 11/2001 Tateishi et al. ............... 439/71

* cited by examiner

Primary Examiner—Renee Luebke
(74) Attorney, Agent, or Firm—Lawrence E. Laubscher, Jr.

(57) ABSTRACT

There are provided a pair of contacts which are housed in a hole portion formed in an insulation member, to be brought into contact with two connection objects, a conductive member provided on an internal circumference surface of the hole portion, and a resilient member which urges the contacts outwards and is deformed due to the urging of the contacts to electrically connect the contacts to the conductive member, wherein the connection objects are pressed to be in contact with the two contacts, thus bending the resilient member, so that the contacts are brought into contact with the conductive member at fixed positions to thereby ensure a stable electrical connection between the two connection objects.

13 Claims, 13 Drawing Sheets

(a)

(b)

(a)

(b)

(c)

CONTACT UNIT AND SOCKET FOR ELECTRICAL PARTS

BACKGROUND OF THE INVENTION

1. Field of the Invention

The present invention relates to a contact unit and a socket for electrical parts, for electrically connecting two connection objects. In particular, the present invention relates to a contact unit and a socket for electrical parts, for pressing connection objects to be in contact with contacts, which are housed in a hole portion disposed with a conductive member on an internal circumference surface thereof and protrude by being urged outwards by a resilient member, to bend the resilient member, and bringing the contacts into contact with the conductive member at fixed positions, to ensure a stable electrical connection.

2. Description of the Related Art

Heretofore, such a type of contact unit has been disclosed in Japanese Unexamined Patent Publication No. 11-297439, which is applied to a socket for electrical parts used for performance testing of electrical parts. In this contact unit, the main parts of which are shown enlarged in FIG. 14, a plurality of through holes 2 is formed in a guide plate 1 provided on the bottom portion of a frame (not shown in the figure) so as to face contact electrodes 4 of a circuit board 3, conductive films 5 are formed in the internal circumference surfaces of the through holes 2, and the through holes 2 are provided with coil type contacts 6, so as to make contact between connection terminals 8 made of solder balls which are formed in an arrangement on the bottom face of an electrical part 7, and the contact electrodes 4 of the circuit board 3.

In this contact unit, when the coil type contact 6 is pressed from both above and below, by the circuit board 3 and the electrical part 7, respectively, the coil type contact 6 is compressed to be bent, and then, is brought into contact with the conductive film 5 formed on the internal circumference surface of the through hole 2 at points P1, P2 and P3. In this case, short-circuit is caused between P1 and P3 by the conductive film 5, thus the connection resistance between the connection terminal 8 of the electrical part 7 and the contact electrode 4 of the circuit board 3 is reduced, and the inductance is also reduced.

However, in such a conventional contact unit, the bending state of the coil type contact 6 is not limited to that shown in FIG. 14, and sometimes, the coil type contact 6 is bent so as to be in contact with the conductive film 5 at the points P1 and P2 as shown in FIG. 15, for example. In this case, short-circuit is caused between P1 and P2 by the conductive film 5, and the connection resistance is reduced. However, the connection resistance in this case is greater than the connection resistance in FIG. 14.

Furthermore, as shown in FIG. 16, there may be a possibility that the coil type contact 6 is bent so as to be in contact with the conductive film 5 only at the point P2. In this case, since the connection resistance and inductance are those intrinsic to the coil type contact 6, values thereof are greater than those in the cases of FIG. 14 and FIG. 15 as described above.

Thus, according to the conventional contact unit, the bending state of the coil type contact 6 is not constant, and there is a variation in the connection resistance between the plurality of connection terminals 8 of the electrical part 7 and the contact electrodes 4 of the circuit board 3, so that it is not possible to carry out the stable performance testing of the electrical part 7. In particular, this variation in the connection resistance and inductance is caused by unstable electrical connection, so there is a concern that the performance testing of high frequency characteristics of electrical parts would be unreliable.

SUMMARY OF THE INVENTION

The present invention deals with such problems with an object of providing a contact unit and a socket for electrical parts, for ensuring stable electrical connection.

In order to achieve the above object, a contact unit according to the present invention electrically connects two connection objects using a connecting device housed in a hole portion formed in at least one face of an insulating member, wherein the connecting device comprises; a contact which is pressed to be in contact with a connection terminal of at least one of the two connection objects, to be electrically connected to the one connection object; a conductive member provided on an internal circumference surface of the hole portion to electrically connect between the contact and the other connection object; and a resilient member which urges the contact outwards to protrude it partially from the hole portion and is deformed due to the urging of the contact.

In such a construction, the contact which is housed in the hole portion provided in at least one face of the insulating member and is urged outwards by the resilient member to protrude from the hole portion, is pressed by the connection terminal of at least one of the two connection objects to bend the resilient member, and is brought into contact with the conductive member, which is provided on the internal circumference surface of the hole portion to electrically connect between the contact and the other connection object, thus enabling to electrically connect the two connection objects. Accordingly, it is possible to reduce a variation in the connection resistance between the two connection objects by assuredly bringing the contact into contact with the conductive member provided on the internal circumference surface of the hole portion in an approximately fixed position, thereby ensuring a stable electrical connection. As a result, it is possible to improve the accuracy of the performance testing of electrical parts and the like. Furthermore, the current path between two connection objects is shortened. Thus, it is possible to perform the stable testing of high frequency characteristics of connection objects.

Moreover, the contact is formed with a cavity for receiving the connection terminal of the connection object, in an end face thereof at which the contact is in contact with the connection terminal, and at least one projection is provided on a rim of this cavity. Accordingly, the connection terminal is retained by the cavity formed in the end face at which the contact is in contact with the connection terminal of the connection object, so that an oxide film formed on the surface of the connection terminal can be broken through by means of at least one projection provided on the rim of this cavity. As a result, it is possible to make an electrical connection reliable between the connection terminal of the connection object and the contact.

Furthermore, a socket for electrical parts according to the preset invention comprises; a mounting portion for detachably mounting an electrical part provided with a plurality of connection terminals arranged on one face thereof; and a contact unit that electrically connects the connection terminals of the electrical part mounted on the mounting portion and contact electrodes of a circuit board facing the electrical part, using a connecting device housed in a hole portion formed in at least one face of an insulating member, wherein the connecting device comprises: a contact which is pressed to be in contact with the connection terminal of the electrical part to be electrically connected to the electrical part; a conductive member provided on an internal circumference surface of the hole portion to electrically connect between the contact and the circuit board; and a resilient member which urges the contact outwards to protrude it partially from the hole portion and is deformed due to the urging of the contact.

In such a construction, the contact which is housed in the hole portion provided in at least one face of the insulating member and is urged outwards by the resilient member to protrude from the hole portion, is pressed by the connection terminal of the electrical part detachably mounted on the mounting portion to bend the resilient member, and is brought into contact with the conductive member, which is provided on the internal circumference surface of the hole portion to electrically connect between the contact and the circuit board, thus enabling to electrically connect the electrical part and the circuit board. Accordingly, it is possible to reduce a variation in the connection resistance between the electrical part and the circuit board by assuredly bringing the contact into contact with the conductive member provided on the internal circumference surface of the hole portion in an approximately fixed position, thereby ensuring a stable electrical connection. As a result, it is possible to improve the accuracy of the performance testing of electrical parts and also to apply the electrical socket according to the present invention to the stable testing of high frequency characteristics of electrical parts.

DETAILED DESCRIPTION OF THE INVENTION

Figure 1:
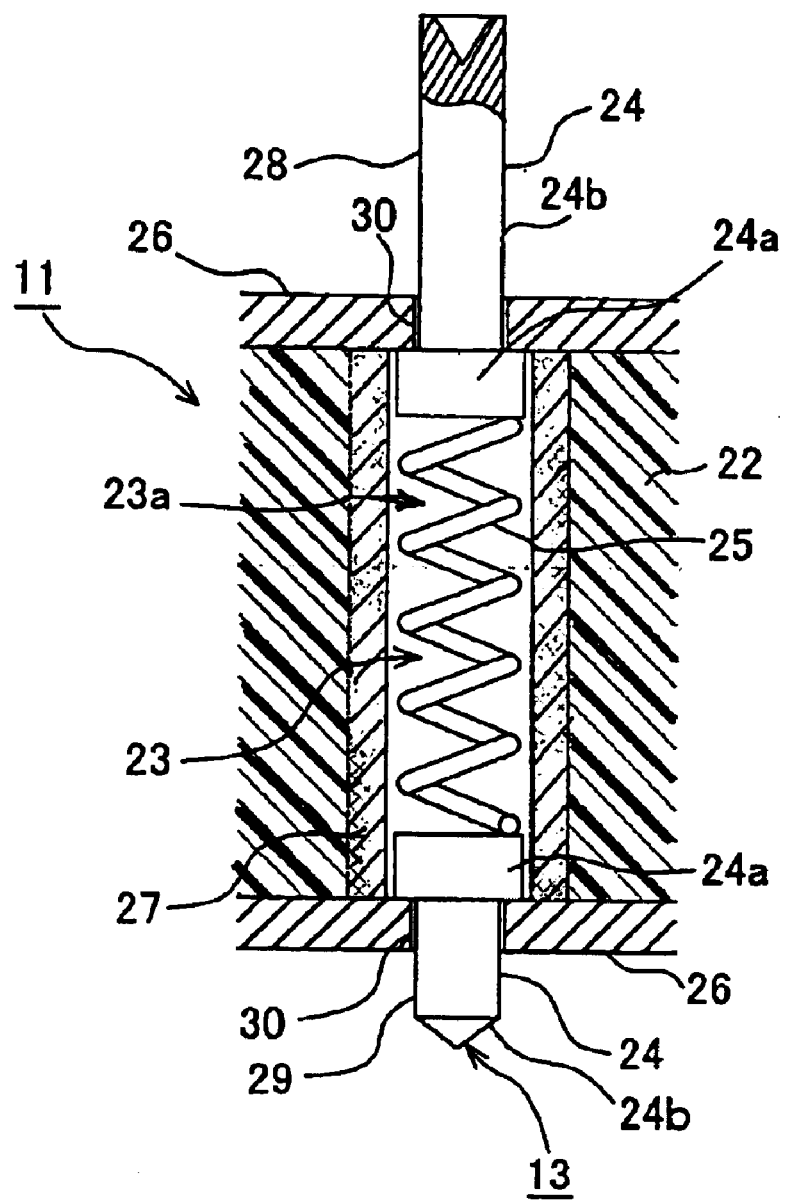
FIG. 1 is an enlarged cross-sectional view showing main parts of a first embodiment of a contact unit according to the present invention.

FIG. 1 is a cross-sectional view describing a first embodiment of a contact unit according to the present invention. This contact unit 11 electrically connects two connection objects, and comprises an insulating member 22 and a connecting device 13. Hereunder, a description will be made for the case where an electrical part and a circuit board are adopted as the two connection objects.

The insulating member 22 is made of glass, ceramic or the like, for example, and is formed with a hole portion 23 in at least one face thereof. The hole portion 23 houses and retains therein the connecting device 13, and its internal circumference surface is made smooth by grinding or the like. To be specific, the hole portion 23 includes a through hole 23a which is formed to pass through the insulating member 22. A plurality of hole portions 23 is formed corresponding to a plurality of connection terminals of the electrical part and a plurality of contact electrodes of the circuit board. Note, the insulating member 22 may be made of a glass fiber with epoxy resin, a known insulating resin material or the like.

Each of the plurality of hole portions 23 houses therein the connecting device 13. This connecting device 13 is for connecting the contact electrode of the circuit board and the connection terminal of the electrical part, and comprises contacts 24, a conductive member 27, and a resilient member 25.

Paired contacts 24 are provided on opposite end portions of the connecting device 13. These contacts 24 are pressed to be in contact with the connection terminal of the electrical part and the contact electrode of the circuit board, to connect them electrically. One of the contacts 24 comprises a first contact pin 28 which is in contact with the connection terminal of the electrical part, and the other of the contacts 24 comprises a second contact pin 29 which is in contact with the contact electrode of the circuit board. In each of the first and second contact pins 28 and 29, a pin contact 24b, protruding through the insulating member 22, is narrower than a base 24a inside the through hole 23a, and is formed of a conductive member such as brass. In addition, at least the surfaces of the bases 2 of the first and second contact pins 28 and 29 may have a lubricating plating as an intermediate layer on a nickel (Ni) foundation, and gold plating (Au) on the top face.

Figure 2:
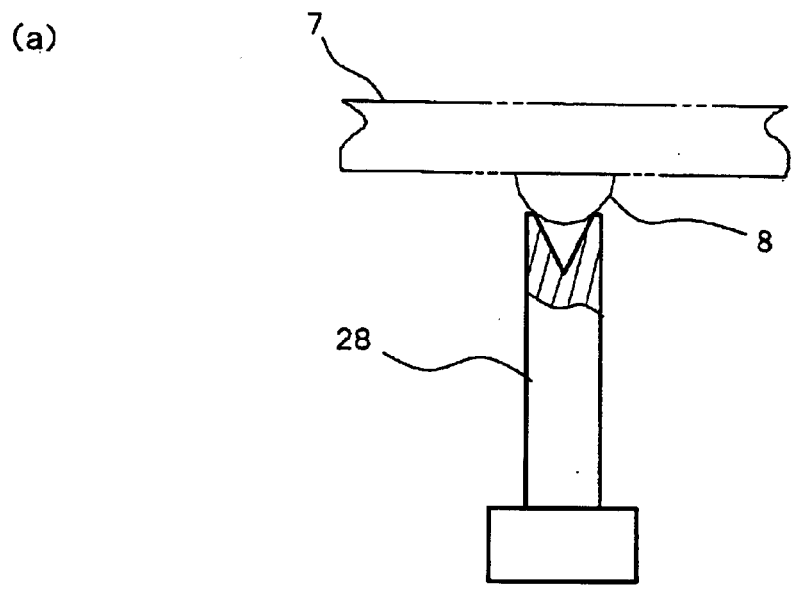
FIG. 2 is an explanatory diagram showing examples of the shape of a contact end face of a contact.
Figure 2:
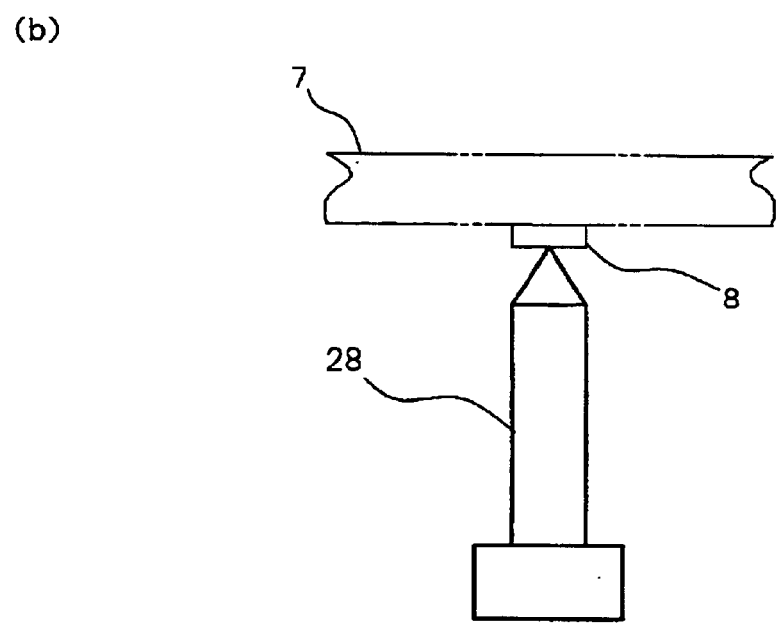

Here, a contact end face at the first contact pin 28 is of (a) a concave cone shape, or (b) a convex cone shape, as shown in FIG. 2, for example. The concave cone shape shown in (a) in the figure is suitable for receiving a ball shaped connection terminal on a BGA (Ball Grid Array) type electrical part, and the convex cone type shown in (b) in the figure is suitable for ensuring a stable contact with a pin shaped connection terminal of a PGA (Pin Grid Array) type electrical part. In addition, the shape of the contact end face is not limited to those shown in FIG. 2, and may be a flat surface, a crown shape or the like, for example.

The conductive member 27 is provided on the internal circumference surface of the hole portion 23. This conductive member 27 is in contact with the pair of contacts 24, to cause electrical short-circuit between the contacts, and may be made of a copper (Cu)-nickel (Ni)-gold (Au) plated film, for example. Furthermore, the conductive member 27 may have a lubricating plating as an intermediate layer on a nickel (Ni) foundation, and gold plating (Au) on the top surface. In this case, the lubricating plating contains 83% Ni, 9% phosphorus (P), and 8% Teflon (PTFE; registered trademark), for example, and is formed to have a thickness of 0.2 µm to 0.3 µm. Thus, the conductive member 27 smoothly contacts with the contacts 24, whose surfaces have a lubricating plating, thereby enabling to prevent the contacts 24 from pressing against the conductive member 27 too tightly to move even in a testing in an inert gas atmosphere. Note, the conductive member 27 is not limited to the one formed by thin film, and may be formed by a metallic tube pressed into the through hole 23a.

Furthermore, the resilient member 25 is inserted between the first and second contact pins 28 and 29. This resilient member 25 is a coil spring, for example, which urges the first and second contact pins 28 and 29 outwards to protrude them partially from opposite ends of the through hole 23a, and is bent when the first and second contact pins 28 and 29 are pressed inwards. The opposite ends of this resilient member 25 are not brought into contact with end faces of the bases 24a of the contacts 24 evenly in a ring shape or the like, but is brought into contact with one point of a site which is away from the center line of the contact 24, to thereby urge the contacts 24 (the first and second contact pins 28 and 29) to rotate when pressed inwards. Note, the resilient member 25 may be formed of either conductive material or insulating material. Furthermore, the resilient member 25 is not limited to a coil spring, and may be a sponge or any other material having retractable and resilient characteristic.

Retaining members 26 are provided on the opposite ends of the through hole 23a. These retaining members 26 retain the first and second contact pins 28 and 29 housed in the through hole 23a at open ends of the through hole 23a, to prevent them from falling out. To be specific, the retaining members 26 are formed with apertures 30 that are smaller than the external profiles of the bases 24a of the first and second contact pins 28 and 29, and larger than the external profiles of the pin contacts 24b, and the pin contacts 24b are inserted through the apertures 30, to close the opposite ends of the through holes 23a.

Figure 3:
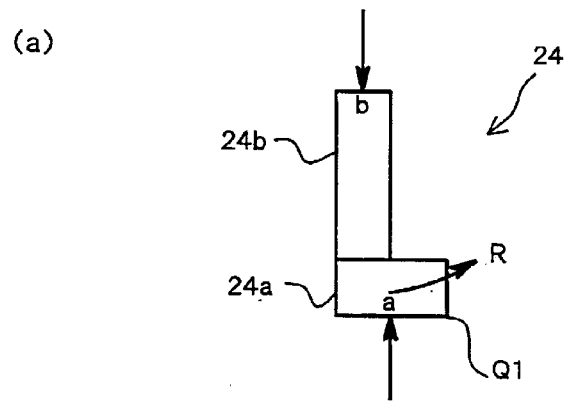
FIG. 3 is an explanatory diagram showing alternative shapes of the contact.
Figure 3:
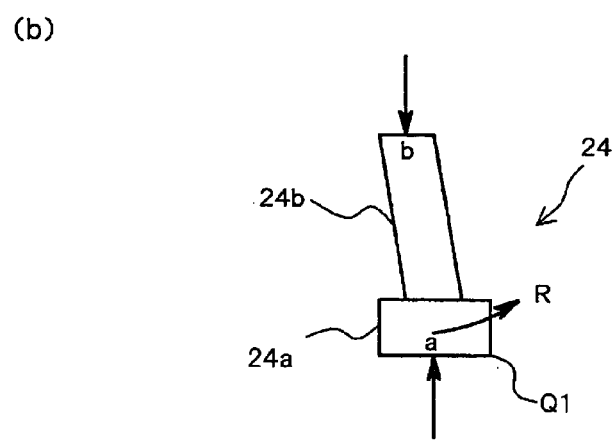
Figure 3:
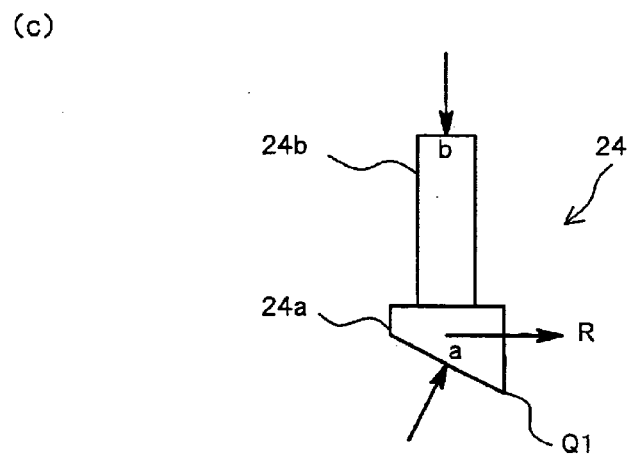

FIG. 3 shows alternative shapes of the contact 24. In (a) of the figure, the formation is such that the centerlines of the base 24a and the pin contact 24b are offset laterally. According to this formation, since an average point of action "a" of a force exerted by the resilient member 25 pressing the base 24a upward due to its compressive restoring force, and a point of action "b" of a force exerted by the connection terminal of the electrical part pressing the pin contact 24b downward, are offset laterally as shown in, the figure. And also, since the directions of the forces are opposed to each other, the base 24a of the contact 24 is rotated in the direction of arrow R, and the point Q1 is brought into contact with the conductive member 27 formed on the internal circumference surface of the through hole 23a shown in FIG. 1.

Furthermore, in (b) of FIG. 3, the formation is such that the centerlines of the base 24a and the pin contact 24b are offset diagonally. According to this formation, since the average point of action "a" of the force exerted by the resilient member 25 pressing the base 24a upward due to its compressive restoring force, and the point of action "b" of the force exerted by the connection terminal of the electrical part 7 pressing the pin contact 24b downward, are offset laterally as shown in the figure. And also, since the directions of the forces are opposed to each other, the base 24a of the contact 24 is rotated in the direction of arrow R, and the point Q1 is brought into contact with the conductive member 27 on the internal circumference surface of the through hole 23a shown in FIG. 1.

Moreover, in (c) of FIG. 3, the formation is such that the end face of the base 24a is inclined relative to the centerline of the base 24a. According to this formation, the average point of action "a" of the force exerted by the resilient member 25 pressing the base 24a of the contact 24 upward due to its compressive restoring force, and the point of action "b" of the force exerted by the connection terminal of the electrical part 7 pressing the pin contact 24b downward, coincide vertically, However, since the direction in which the resilient member 25 presses against the base 24a is toward the top right as shown in the figure, the base 24a travels in the direction of arrow R, and the point Q1 is brought into contact with the conductive member 27 on the internal circumference surface of the through hole 23a shown in FIG. 1.

In each of the above-described cases, it is possible to bend the resilient member 25 in a fixed direction assuredly, so as to ensure a stable contact of the contacts 24 and the conductive member 27 on the internal circumference surface of the through hole 23, thus enabling to reduce a variation in the connection resistance between the plurality of connection terminals of the electrical part and the contact electrodes of the circuit board.

Next is a description of an operation of the contact unit 11 with such a construction. Here, the description is made for the case where the contact unit 11 is applied to, for example, a socket for electrical parts.

Figure 4:
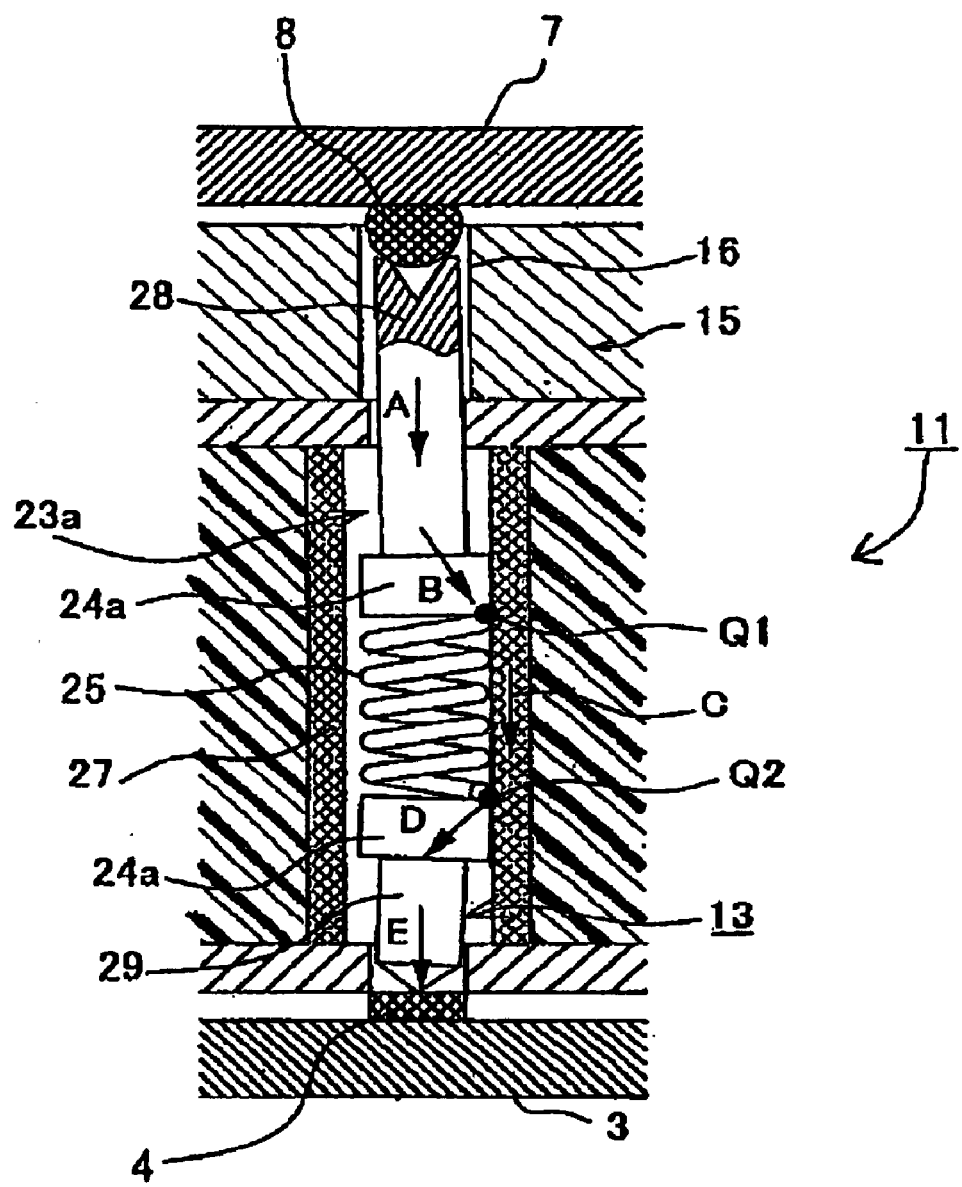
FIG. 4 is a cross-sectional view for explaining an operation of the contact unit according to the first embodiment.

Firstly, as shown in FIG. 4, a connection terminal 8 of an electrical part 7 and a contact electrode 4 of a circuit board 3 are positioned relative to the connecting device 13. The connecting device 13 is pressed from both above and below by the electrical part 7 and the circuit board 3, respectively. At this time, the electrical part 7 inserts the connection terminal 8 into a pin guide hole 16 in a floating plate 15 provided in a mounting portion mounting the electrical part 7 of a socket for electrical parts, to press the floating plate 15 downwards. Then, the connection terminal 8 is brought into contact with the first contact pin 28 of the contact unit 11 inserted into the pin guide 16, to press the first contact pin 28 down further.

In this manner, since the first and second contact pins 28 and 29 are pressed from both above and below by the connection terminal 8 of the electrical part 7 and the contact electrode 4 of the circuit board 3 respectively, both are pressed into the through hole 23a. Thus, the resilient member 25 is compressed and bent. Consequently, the first and second contact pins 28 and 29 incline a little from the upright state, and are brought into contact with the conductive member 27 at the points (Q1 and Q2 of the bases 24a.

As a result, current flows through the first contact pin 28 from the connection terminal 8 of the electrical part 7 as indicated by the arrows A and B, flows through the conductive member 27 between the points Q1 and Q2 in the direction of the arrow C, entering the second contact pin 29 from the point Q2, and flows through the second contact pin 29 as indicated by the arrows D and E to reach the contact electrode 4 of the circuit board 3.

According to the first embodiment, since the first and second contact pins 28 and 29 are pressed inwards by the connection terminal 8 of the electrical part 7 and the contact electrode 4 of the circuit board 3, respectively, and pushed together inside of the through hole 23a, the first and second contact pins 28 and 29 move closer to each other. Furthermore, since the first and second contact pins 28 and 29 incline a little from the upright state due to bending of the resilient member 25 inserted between them, and are brought into contact with the conductive member 27 formed on the internal circumference surface of the through hole 23a at the points Q1 and Q2 of the base 24a, in an approximately fixed position, assuredly, a distance between the points Q1 and Q2 is short-circuited by the conductive member 27 on the internal circumference surface of the through hole 23a, thereby reducing the current path. Thereby, it is possible to stably carry out performance testing of the high frequency characteristics of the electrical part 7.

Furthermore, the variation in the connection resistance between the plurality of connection terminals 8 of the electrical part 7 and the contact electrodes 4 of the circuit board 3 is reduced, and stable electrical connections are ensured, so that it is possible to improve the reliability of performance testing of the electrical part 7.

Moreover, it is possible to measure the electrical performance related to each connection terminal of the electrical part 7 using a plurality of connecting devices 13 at the same time.

Furthermore, by means of the retaining members 26, it is possible to prevent the contacts 24 housed in the through hole portion 23 from falling out of the open ends of the through hole portions 23. Accordingly, it becomes easy to handle the contact unit 11.

Figure 5:
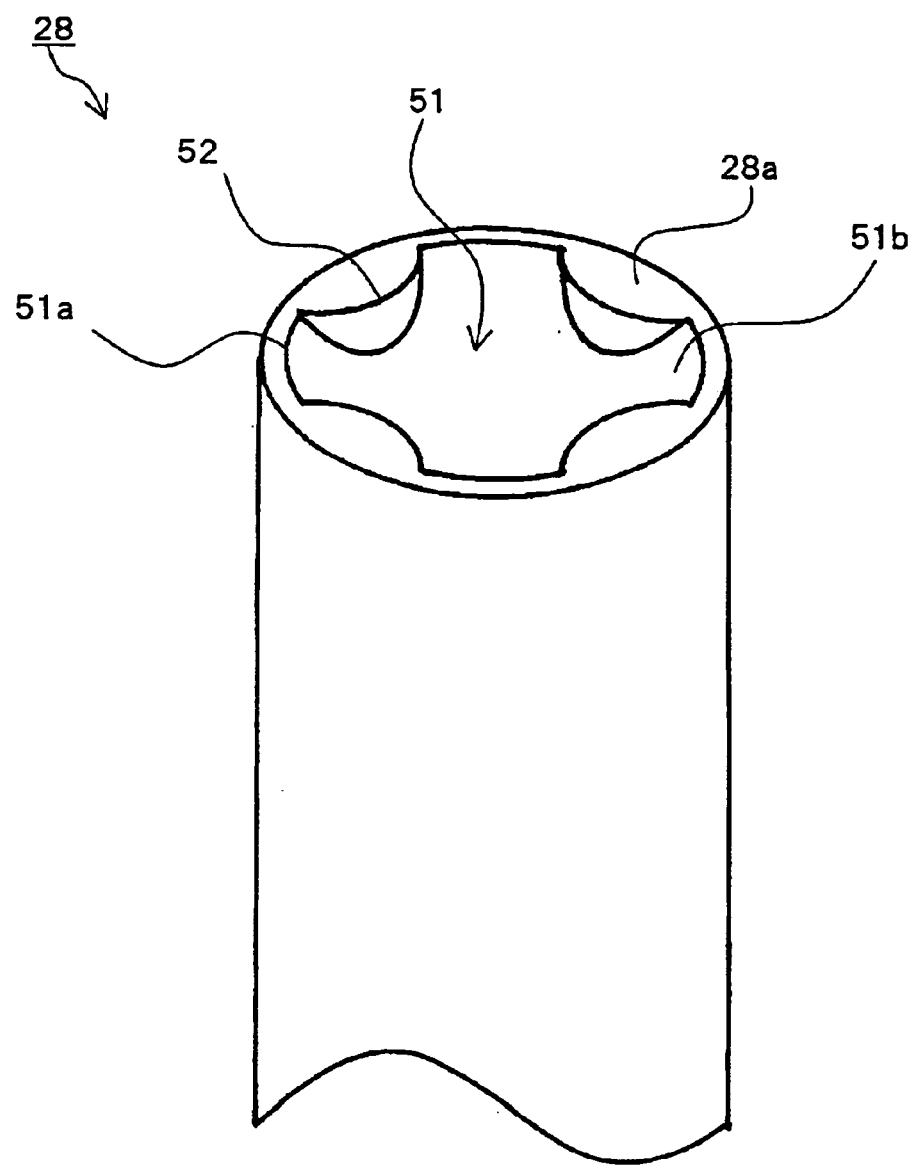
FIG. 5 shows a modified example of the shape of the contact end face of the contact.

FIG. 5 shows a modified example of the shape of the contact end face of the contact (a first contact pin 28), which is in contact with the connection terminal 8 of the electrical part 7.

Figure 6:
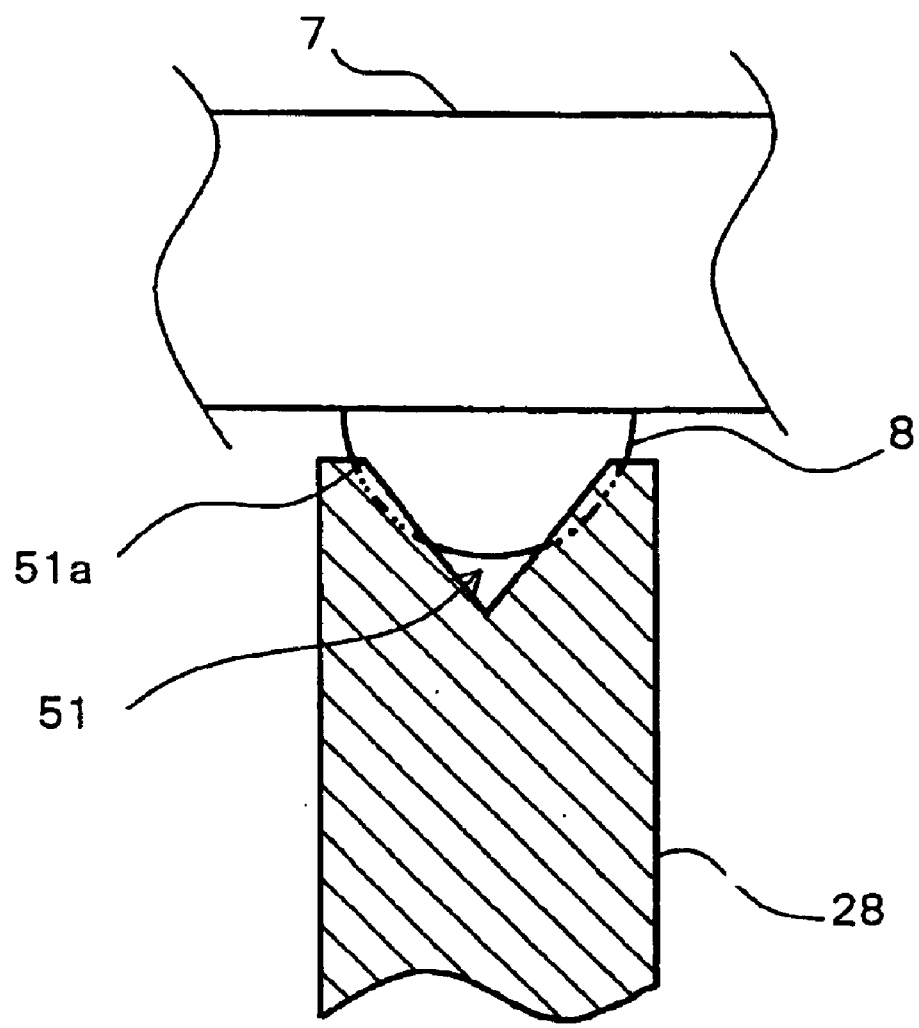
FIG. 6 is an explanatory diagram showing a connection state of the contact having a concave cone shaped contact end face and a connection terminal of an electrical part.

The contact end face of the first contact pin 28 may be a concave cone shape as shown in (a) of FIG. 2. However, in this case, there is a possibility that the connection terminal 8 consisting of a solder ball of the electrical part 7 is softened in a high temperature testing, and confined in a cavity 51 to be deformed as shown in FIG. 6, for example, leaving a ring scar on the surface of the connection terminal 8. Furthermore, if there is significant deformation of the connection terminal 8, there is also a possibility that the top of the ball shaped connection terminal 8 is damaged.

Moreover, since a rim 51a of the cavity 51 is in a circular shape, the perimeter of the rim 51a is brought into contact with the ball shaped connection terminal 8 of the electrical part 7, thus increasing a contact area. Consequently, a contact pressure between the first contact pin 28 and the connection terminal 8 is dispersed and diminished. Therefore, since it is not possible to break the oxide film formed on the surface of the solder ball connection terminal 8 for example, the connection resistance is varied. Hence, there is a possibility that an electrically stable contact cannot be ensured.

Therefore, in order to deal with such problems, the first contact pin 28 as shown in FIG. 5 includes the cavity 51 and projections 52.

Here, the cavity 51 receives the ball shaped connection terminal 8 of the electrical part 7 to connect it to the first contact pin 28, and an inner surface thereof is formed as an inclined surface 51b inclined inwards from the rim 51a. For example, as shown in FIG. 5, the inner surface of the cavity 51 is formed in a conical shape inclined towards the central part of the first contact pin 28 from the rim 51a. The inclined surface 51b may be formed to be inclined in one direction from the rim 51a. Furthermore, the bottom face of the cavity 51 may be formed in a spherical surface shape to match with the shape of the ball shaped connection terminal 8.

Moreover, the projections 52 are disposed around the rim 51a of the cavity 51. The projections 52 break the oxide film formed on the connection terminal 8 consisting of a solder ball, to ensure the stability of the electrical connection of the first contact pin 28 with the connection terminal 8. As shown in FIG. 5 for example, four projections 52 with an approximately semi-circular cross section are disposed at 90 degrees intervals around the circumference. In addition, the cross section of each projection 52 is not limited to a semi-circular shape provided that it can break the oxide film formed on the connection terminal 8, and may be of a triangular shape or the like, for example, Furthermore, the number of projections 52 is not limited to four, and it may be any number from one upwards.

Figure 7:
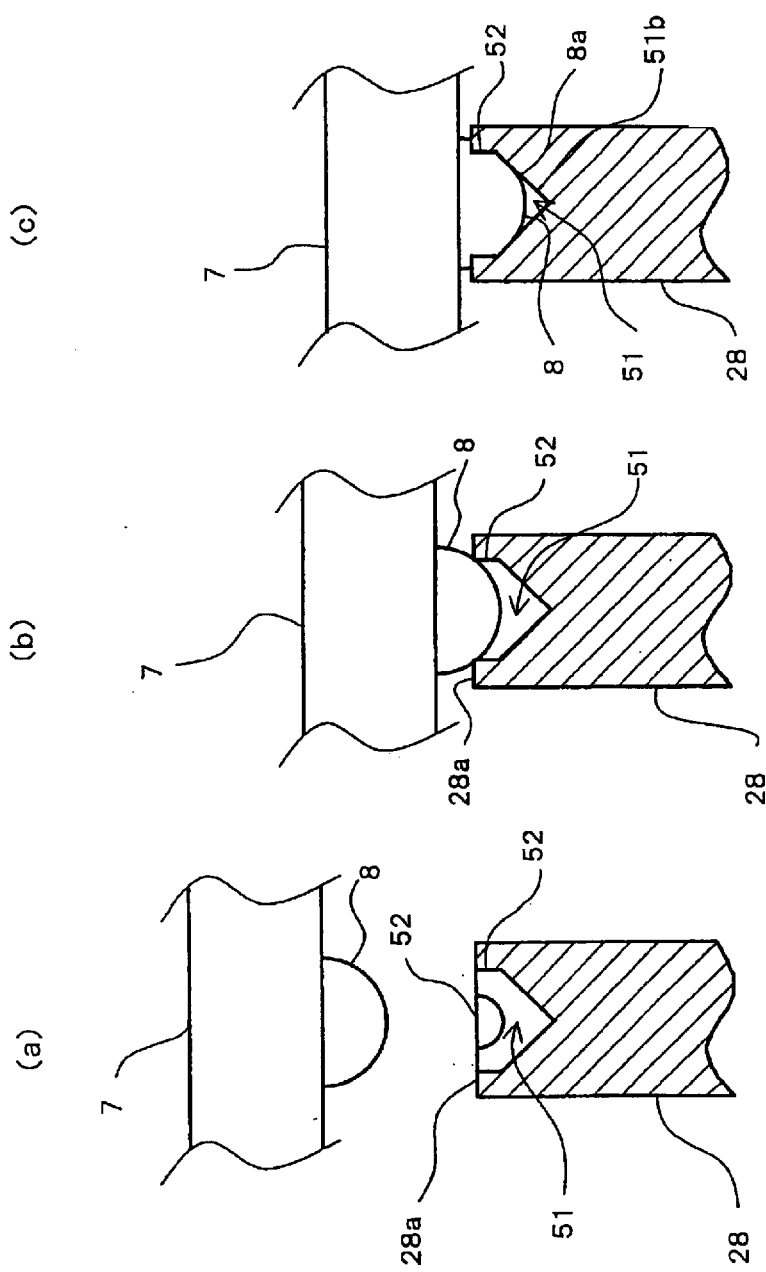
FIG. 7 is an explanatory diagram showing a connection state of the contact in FIG. 5 and the connection terminal of the electrical part.

Next is a description of an operation of the first contact pin 28 with such a construction, with reference to FIG. 7.

Firstly, as shown in (a) of FIG. 7, the ball shaped connection terminal 8 of the electrical part 7 is positioned above the first contact pin 28. Next, as shown in (b) of the figure, by pressing the electrical part 7 onto the first contact pin 28 from above, the connection terminal 8 is brought into contact with the projections 52 of the cavity 51 formed in the contact end face 28a of the first contact pin 28 and is retained there. In this case, since the contact pressure between the connection terminal 8 and the first contact pin 28 is concentrated on tip ends of the projections 52, the oxide film formed on the solder ball surface of the connection terminal 8 is broken effectively, so that the connection terminal 8 and the first contact pin 28 are connected to each other electrically and assuredly. The electrical part 7 and the first contact pin 28 may be placed in the high temperature atmosphere for testing in this condition.

Here, as shown in (c) of FIG. 7, if a strong pressure is applied to the electrical part 7, since the connection terminal 8 is softened in the high temperature atmosphere, it sinks into the cavity 51 and the ball surface 8a of the connection terminal a is brought into contact with the inclined surface 51b of the cavity 51, and is stopped.

According to the first contact pin 28 with such a construction, since the connection terminal 8 of the electrical part 7 is brought into contact with the projections 52 formed on the rim 51a of the cavity 51, the contact pressure is concentrated on the tip ends of the projections 52. Therefore, the projections 52 break the oxide film on the surface of the connection terminal 8 even with a small contact pressure, thus enabling a reliable electrical connection between the connection terminal 8 and the first contact pin 28. As a result, it is possible to improve the reliability of performance testing of the electrical part 7.

Furthermore, since the connection terminal 8 is in contact with the projections 52 and is retained, then even in the case where the solder ball connection terminal 8 is softened in the high temperature atmosphere, the projections 52 cause only minor indentations dotted on the surface of the connection terminal B, so that it is possible to avoid noticeable deformities.

Moreover, since the inside surface of the cavity 51 is formed as an inclined surface 51b inclined inwards from the rim 51a, then even if the solder ball connection terminal 8 is softened in the high temperature atmosphere and sinks into the cavity 51, the ball surface 8a is brought into contact with the inclined surface 51b and is stopped. Accordingly, it is possible to prevent the top of the ball shaped connection terminal 8 from being deformed.

Figure 8:
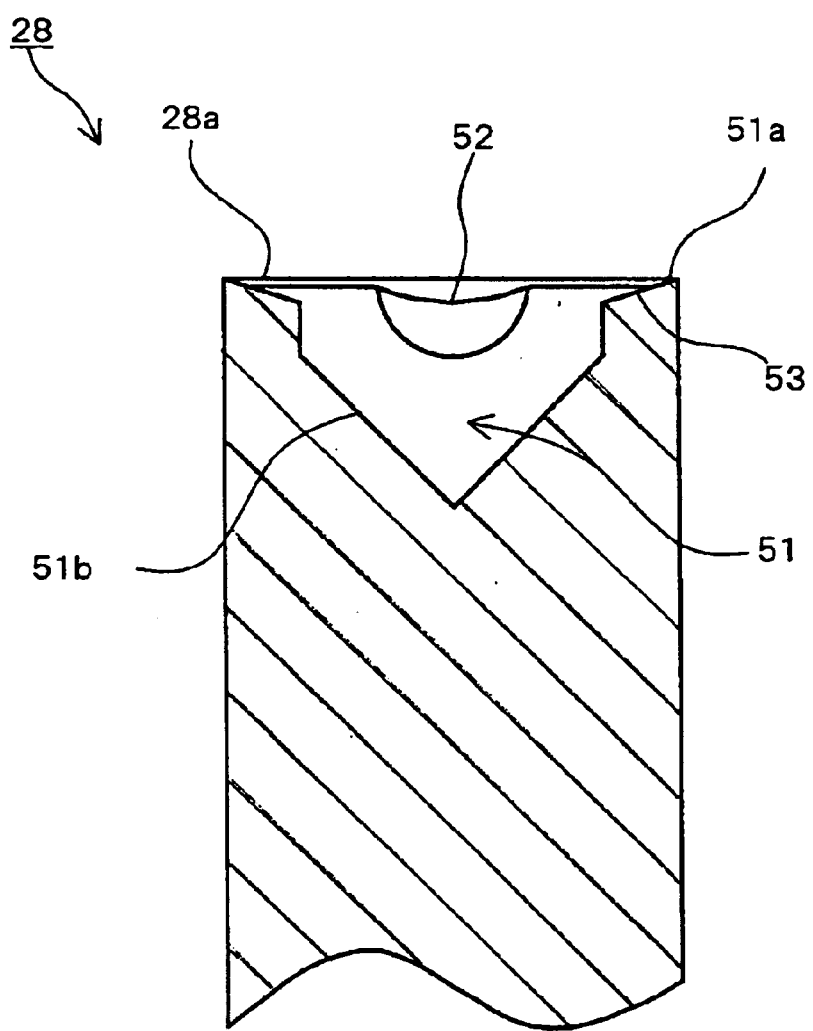
FIG. 8 shows another modified example of the shape of the contact end face of the contact.

FIG. 8 shows another modified example of the shape of the contact end face of the first contact pin 28.

Figure 9:
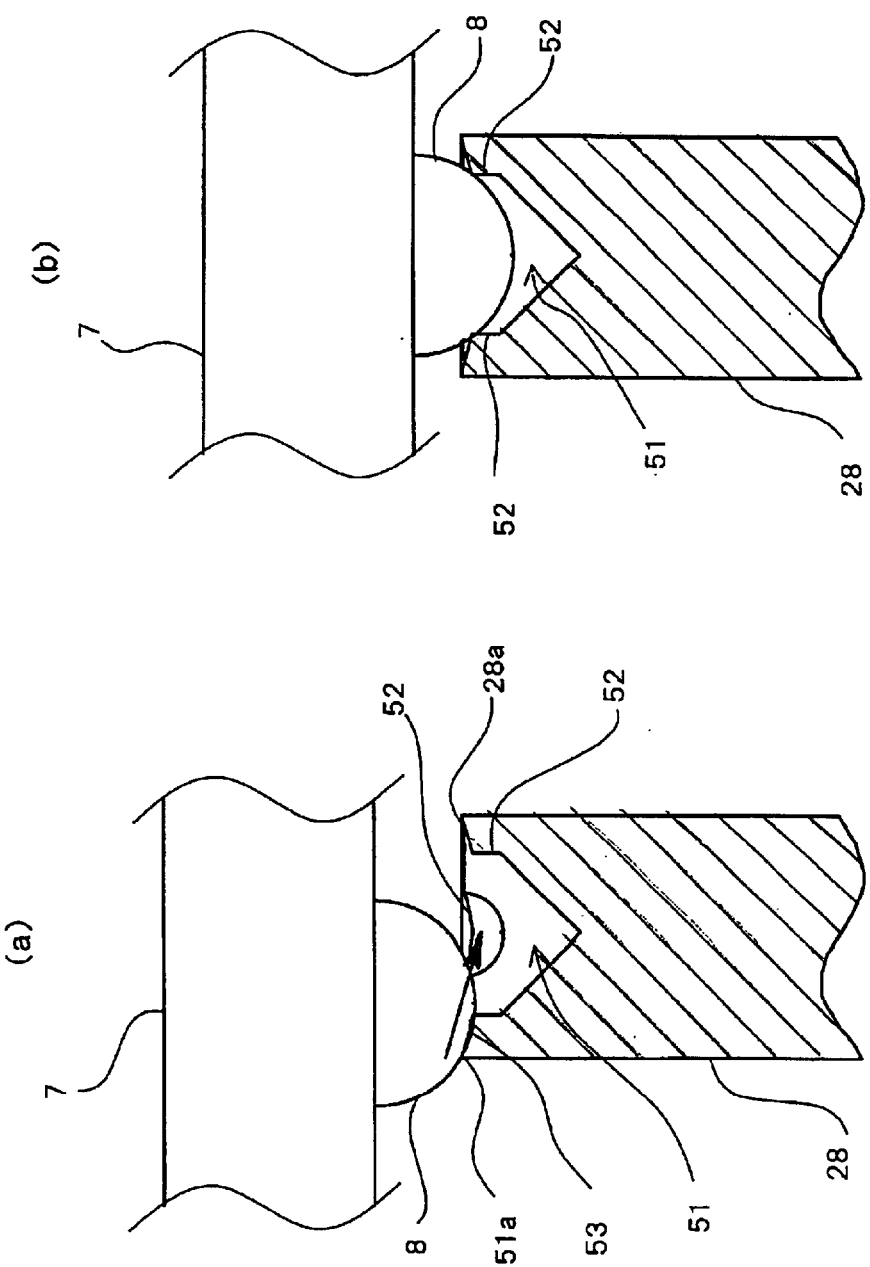
FIG. 9 is an explanatory diagram showing a connection state of the contact in FIG. 8 and the connection terminal of the electrical part.

This first contact pin 28 has a guide surface 53 whose slope is shallower than the inclined surface 51b of the rim 51a of the contact end face 28a in the first contact pin 28 as shown in FIG. 5. As a result, as shown in FIG. 9, in the case where the ball shaped connection terminal 8 of the electrical part 7 is brought into contact with the contact end face 28a of the first contact pin 28, even if the connection terminal 8 is brought into contact with the rim 51a of the cavity 51 due to misalignment as in (a) of the figure, the connection terminal 8 is guided to the central part of the cavity 51 by the guide surface 53 in the direction of the arrow shown in the figure, and thus brought into contact with the projections 52 to be retained as shown in (b) of the figure.

According to the first contact pin 28 with such a construction, even in the case where the position at which the connection terminal 8 of the electrical part 7 and the first contact pin 28 are in contact with each other is offset, the connection terminal 8 is guided by the guide surface 53 formed on the contact end face 28a of the first contact pin 28, and positioned in the correct position in the central part of the first contact pin 28. Hence it is possible to ensure the stability of the connection between the connection terminal 8 and the first contact pin 28.

Note, in the description of the modified examples of FIG. 5 and FIG. 8, the description has been made for the case where the solder ball is adopted as the connection terminal 8 of the electrical part 7. However, the present invention is not limited to this, and the present invention can be applied to any connection terminal 8 formed of a material that can be deformed in a high temperature testing atmosphere. Furthermore, regarding the shape of the connection terminal 8, it is also possible to apply the present invention to a connection terminal 8 with a shape such as a column or the like other than a ball,.

Moreover, the description of FIG. 8 has been made such that, in the case where the position at which the connection terminal 8 of the electrical part 7 and the first contact pin 28 are in contact with each other is offset, the connection terminal 8 is guided to the correct position by the guide surface 53 of the cavity 51 formed on the contact end face 28a of the first contact pin 28. However, a case can be considered where the first contact pin 28 is guided to the connection terminal 8 of the electrical part 7 by the guide surface 53 formed on the contact end face 28a.

Figure 10:
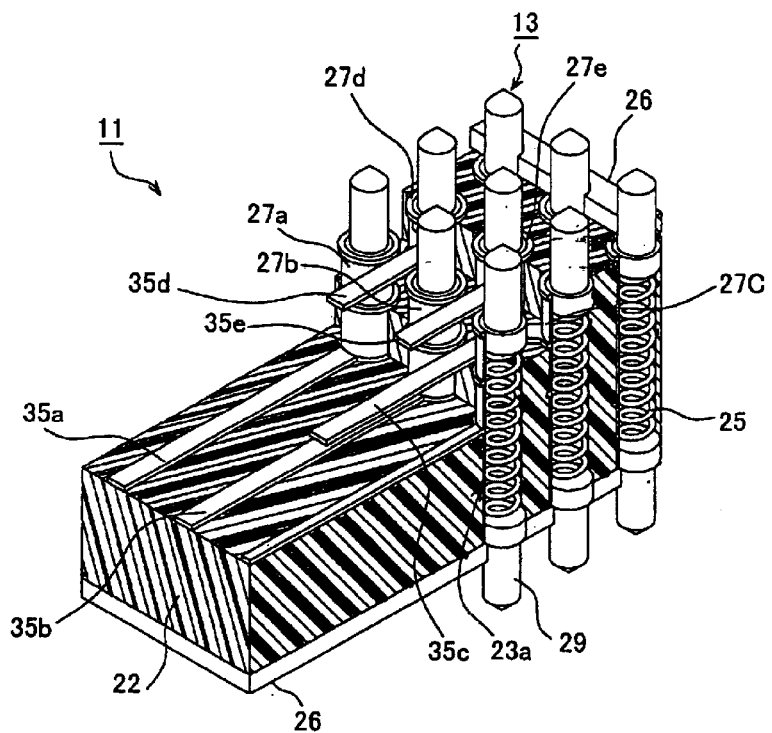
FIG. 10 is an enlarged perspective cross-sectional view showing main parts of a second embodiment of the contact unit according to the present invention.

Next is a description of a second embodiment of the contact unit 11 according to the present invention with reference to FIG. 10.

In this contact unit 11, the insulating member 22 is a multi-layer wiring board, and wiring paths 35a to 35e disposed on the respective layers are connected appropriately to respective conductive members 27a to 27e of through holes 23a. To describe a specific example, a plurality of through holes 23a is provided on the multi-layer wiring board corresponding to the connection terminals 8 of the electrical part 7, and the connecting device 13 is housed in each through hole 23a. The wiring paths 35a and 35b on the first layer of the multi-layer wiring board are respectively connected to the conductive members 27a and 27b of the through holes 23a, the wiring path 35c on the second layer to the conductive member 27c, and the wiring paths 35d and 35 on the third layer are respectively connected to the conductive members 27d and 27e, The other ends of the wiring paths 35a to 35e are connected to the contact electrodes 4 on the circuit board 3 via other connecting devices provided independently at remote locations (not shown in the figure). Alternatively, the other ends of the wiring paths 35a to 35e may be connected directly to the other connecting devices, such as connectors or the like.

In this case, it is possible to connect the plurality of connecting devices 13 provided corresponding to the connection terminals 8 of the electrical part 7 with a plurality of connecting devices provided independently corresponding to me contact electrodes 4 of the circuit board 3 through the multi-layer wiring board, and the layout and pitch of the contact electrodes 4 of the circuit board 3 can be spread out more widely (hereunder fan-out) than the layout and pitch of the connection terminals 8 of the electrical part 7, which are clustered together, thus increasing the degree of freedom in handling the contact electrodes 4 of the circuit board 3. In addition, FIG. 10 shows the second contact pins 29. This makes it possible to deal with the cases of either fanning out or not fanning out the contact electrodes 4 of the circuit board 3.

Figure 11:
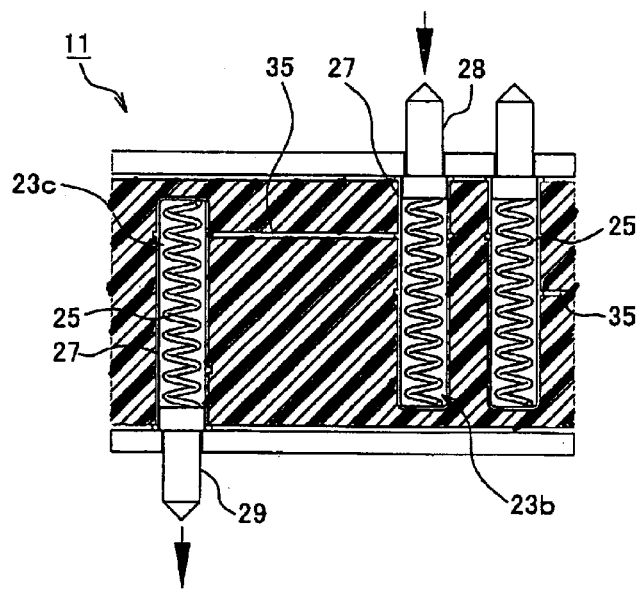
FIG. 11 is a cross-sectional view showing another structural example of the contact unit in FIG. 10.

FIG. 11 shows another structural example of the contact unit 11 having the multi-layer wiring board, in which the layout and pitch of the contact electrodes 4 of the circuit board 3 can be fanned out with respect to the connection terminals 8 of the electrical part 7. That is, the contact unit 11 comprises: the plurality of first contact pins 28, each of which is housed in a first hole (via hole) 23b formed on one face of the multi-layer wiring board and pressed to be in contact with the connection terminals 8 of the electrical part 7 to be electrically connected to the electrical part 7; conductive members 27 each of which is provided on an internal circumference surface of the first hole 23b and is connected electrically with the wiring path 35 formed on each layer of the multi-layer wiring board; and the resilient members 25, which urge the first contact pins 28 outwards to protrude them partially from the first holes 23b, and are bent due to the urging of the first contact pins 28.

Furthermore, the contact unit 11 comprises: the plurality of second contacts 29 each of which is housed in a second hole (via hole) 23c and pressed to be in contact with the contact electrodes 4 of the circuit board 3 to be electrically connected to the circuit board 3; conductive members 27 each of which is provided on an internal circumference surface of the second hole 23c and connected electrically with the conductive member 27 in the first holes 23b via the wiring path 35 formed on each layer of the multi-layer wiring board; and resilient members 25, which urge the second contacts 29 outwards to protrude them partially from the second holes 23c, and are bent due to the urging of the second contacts 29. Here, the first holes 23b and the second holes 23c are formed independently at separate locations.

As a result, the contact electrodes 4 of the circuit board 3 can be fanned out with respect to the layout and pitch of the connection terminals 8 of the electrical part 7, thus increasing the degree of freedom in handling the contact electrodes 4 of the circuit board 3. In addition, in the figure, the first and second holes 23b and 23c are formed to have a predetermined depth. However, these holes may pass through the multi-layer wiring board. In this case, the other open end where the first and second contact pins 28 and 29 are not provided are closed by a separate member. Furthermore, the conductive members 27 provided on the internal circumference surfaces of the first holes 23b may be connected directly to other connecting devices such as connectors or the like via wiring paths on the respective layers of the multi-layer wiring board.

In the above description, the description has been made for the case where the contact unit 11 of the present invention is applied for electrically connecting two objects, being the electrical part and the circuit board. However, the contact unit is not limited to the above, and may be applied for test probes for electrical parts, for example. Furthermore, the contact unit 11 of the present invention may also be adopted as a single unit in which only one through hole 23a, or the first hole 23b or the second hole 23c, is formed in the insulating member to provide the connecting device 13. Moreover, the first and second holes 23b and 23c may be provided apart from each other on the same face of the insulating member, and each housing a connecting device 13. In this case, the conductive members 27 provided on the internal circumference surfaces of the first and second holes 23b and 23c are connected to each other by wiring members. The through holes 23a, or the first holes 23b or the second holes 23c may be formed to be inclined to the direction of the pressure. Thus, it is possible to bend assuredly the resilient members 25, and also it is possible to carry out the stable contact of the housed contacts 24 and the conductive members 27 on the internal circumference surfaces of the through holes 23a or the first holes 23b or the second holes 23c.

Figure 12:
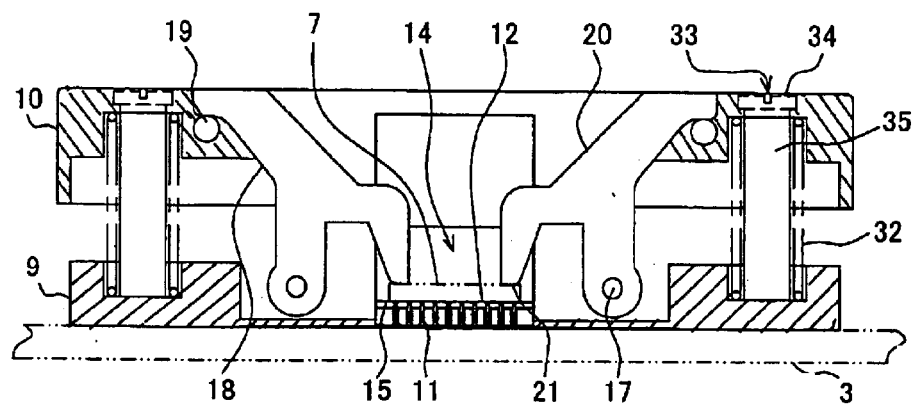
FIG. 12 is a cross-sectional view showing an embodiment of a socket for electrical parts according to the present invention.

Next is a description of an embodiment of a socket for electrical parts according to the present invention with reference to FIG. 12. This socket for electrical parts electrically connects an electrical part of PGA or BGA type or the like, and a circuit board. This socket for electrical parts detachably is used for retaining an electrical part to subject it to burn-in testing or the like for eliminating early life failures, and comprises a main socket body 9, a socket cover 10 and the contact unit 11.

The main socket body 9 positions the electrical part 7 to retain it, which comprises a mounting portion 12 and pressing members 20.

The mounting portion 12 positions the electrical part 7 to mount it thereon, which is formed in an upper middle portion of the main socket body 9. To be specific, the mounting portion 12 is the top of a floating plate 15 which is provided in a recess 14 formed inside the top of the main socket body 9, so as to be movable up and down by being always urged upwards by a coil spring (not shown in the figure). Pin guide holes that receive the first contact pins 28 of the contact unit 11 are formed, at positions corresponding to the connection terminals of the electrical part 7, in the face of the floating plate 15. Note, the structure of the mounting portion 12 is not limited to the above-described floating type, and may be a fixed type.

The pressing members 20 are provided above the mounting portion 12 on both sides. The pressing members 20 press the electrical part 7 from above. The pressing members 20 are axially supported by the main socket body 9 to be rotated freely around pivot pins 17, and outer ends 18 thereof abut on shafts 19 fitted in the socket cover 10 described later, so that the pressing members 20 can be rotated around the pivot pins 17 as the shafts 19 move up and down. They are provided with pressure pads 21 an their inner ends abutting on the top of the electrical part 7 when the pressing members 20 are upright.

Furthermore, me socket cover 10 is provided on the top of the main socket body 9, The socket cover 10 urges the pressing members 20 toward the upright state to retain the electrical part 7. The socket cover 10 is provided with through holes 33 in its corners, and supporting members 35, each of which has a retaining portion 34 formed on the top thereof and other end is fixed in the main socket body 9, are inserted through the through holes 33. Moreover, the shafts 19 are provided on the inside of the socket cover 10. The shafts 19 abut on the outer ends 18 of the pressing members 20 to move up and down, and apply the rotation movement to the pressing members 20. Furthermore, coil springs 32 are installed in the supporting members 35. The coil springs 32 always urge the socket cover 10 upwards, thus maintaining the pressing members 20 in the upright state, so that the electrical part 7 mounted on the floating plate 15 can be retained.

Furthermore, the above-described contact unit 11 is disposed below the mounting portion 12 of the main socket body 9. This contact unit 11 electrically connects the connection terminals 8 of the electrical part 7, and the contact electrodes 4 of the circuit board 3, which face the connection terminals 8. The construction is such that the connecting devices 13 are housed in the plurality of holes 23 provided in the insulating member 22 corresponding to the connection terminals 6 of the electrical part 7 as shown in FIG. 1. The connecting device 13 has a construction to comprise the resilient member 25 and the contacts 24 arranged on both sides of the resilient member 5, and the contact 24 (first contact pin 28) which is brought into contact with the connection terminal 8 of the electrical part 7 is guided into the pin guide hole made in the floating plate 15.

Next is a description of an operation of the socket for electrical parts with such a construction.

Figure 13:
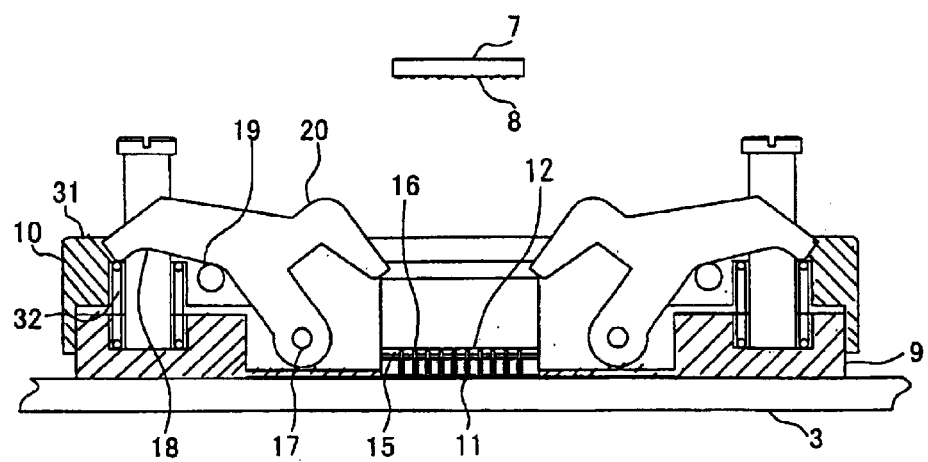
FIG. 13 is a cross-sectional view for explaining an operation of the socket for electrical parts.
Figure 14:
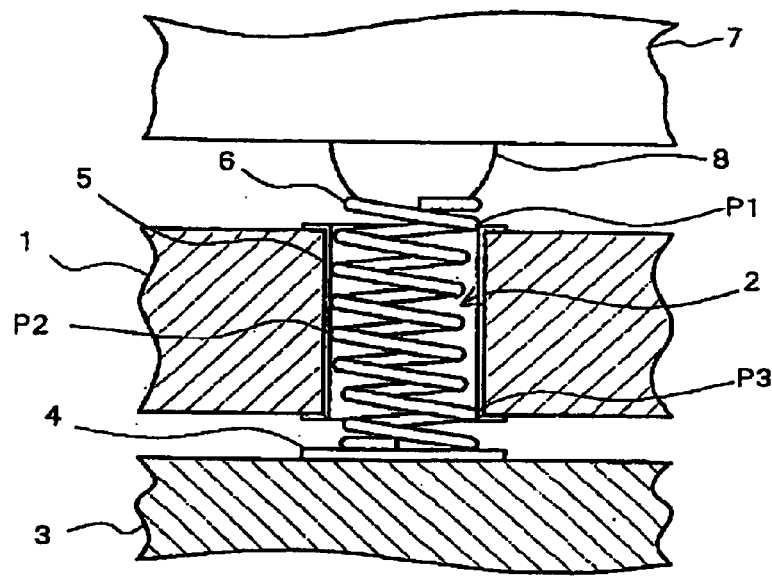
FIG. 14 is an enlarged cross-sectional view showing main parts of a first connection state of a connection terminal of an electrical part and a coil type contact in a conventional contact unit.
Figure 15:
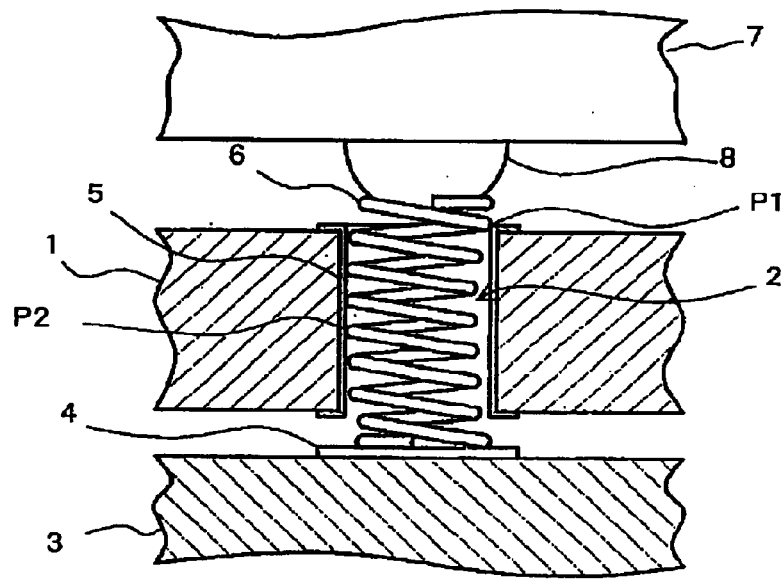
FIG. 15 is an enlarged cross-sectional view showing main parts of a second connection state of the connection terminal of the electrical part and the coil type contact in the conventional contact unit.
Figure 16:
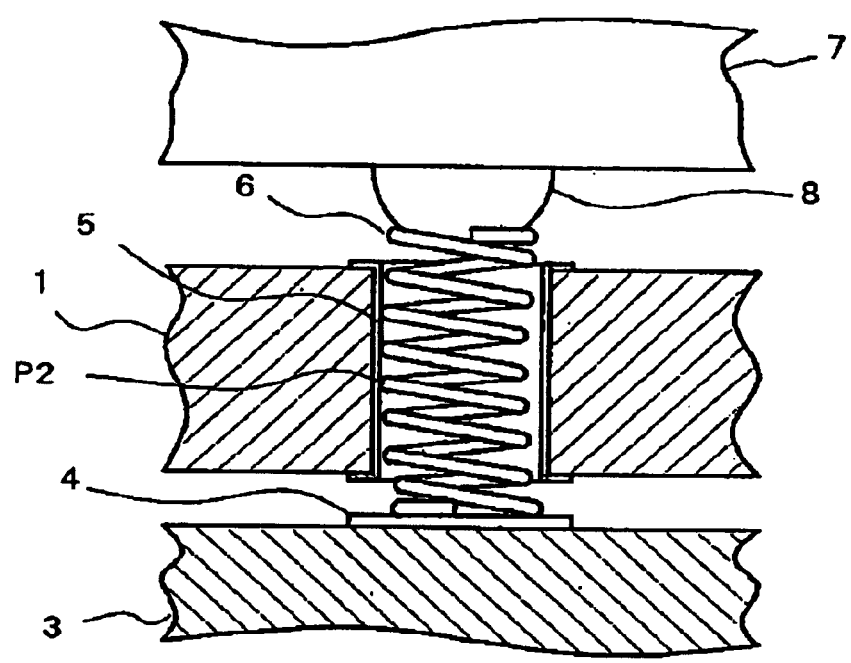
FIG. 16 is an enlarged cross-sectional view showing main parts of a third connection state of the connection terminal of the electrical part and the coil type contact in the conventional contact unit.

Firstly, as shown in FIG. 12, the socket for electrical parts is fixed onto the circuit board 3 and positions the connecting devices 13 of the contact unit 11 and the contact electrodes of the circuit board 3. Next, as shown in FIG. 13, the socket cover 10 is pressed downwards by an external force against urging forces of the coil springs 32. At this time, with the moving downwards of the shafts 19 provided inside the socket cover 10, the pressing members 20, whose outer ends 18 slide over the shafts 19, are rotated around the pivot pins 17 and fall outwards to open above the mounting portion 12, leading a state for the electrical part 7 to be inserted.

Next, the electrical part 7 is mounted onto the mounting portion 12. At this time, the outer edges of the electrical part 7 are controlled by positioning portions provided at the four corners of the mounting portion 12, and the plurality of connection terminals 8 arranged on the lower face of the electrical part 7 is positioned with respect to the pin guide holes 16 of the floating plate 15. Afterwards, a pressing force on the socket cover 10 is removed. Then, the socket cover 10 is pressed upwards by compressive reaction forces of the coil springs 32, and accordingly, the shafts 19 are lifted up. Next, the outer ends 18 of the pressing members 20 are pushed upwards. As a result, the pressing members 20 are rotated around the pivot pins 17 to the upright state. At this time, as shown in FIG. 12, the pressure pads 21 of the pressing members 20 abut the top of the electrical part 7, to press the electrical part 7 downwards.

In this case, with the pressing by the pressing members 20, the electrical part 7 presses the floating plate 15 downwards in a state where the connection terminals 8 are inserted into the pin guide holes 16. Then, the connection terminals 8 are brought into contact with the first contact pins 28 of the connecting devices 13 inserted into the pin guide holes 16 (refer to FIG. 4).

In this manner, the connecting devices 13 are pressed from both above and below by the connection terminals 8 of the electrical part 7 and the contact electrodes 4 of the circuit board 3, respectively, so that the first and second contact pins 28 and 29 are pressed into the through holes 23*a*. As a result, the resilient members 25 are bent, and the base sections 24*a* and 24*b* of the first and second contact pins 28 and 29 are brought into contact with the conductive members 27 provided on the internal circumference surfaces of the through holes 23*a*, to electrically connect between the first and second contact pins 28 and 29. As a result, the connection terminals 8 of the electrical part 7 are electrically connected to the contact electrodes 4 of the circuit board 3 by the connecting devices 13.

In this case, if the contact end faces of the first contact pins 28 are formed as shown in FIG. 6 or FIG. 8, the electrical connections between the connection terminals 8 of the electrical part 7 and the first contact pins 28 are more stable, According to the socket for electrical parts of the present invention, since the first and second contact pins 28 and 29 are pushed into the through holes 23*a* by the electrical part 7 and the circuit board 3 respectively, the first and second contact pins 28 and 29 move closer, shortening the current path. Thus, it is possible to carry out stably testing of the high frequency characteristics of the electrical part 7. Furthermore, since the variation in the connection resistance between the plurality of connection terminals 8 of the electrical part 7 and the contact electrodes 4 of the circuit board 3 is reduced, it is possible to ensure stable electrical connections, and also it is possible to improve the reliability of performance testing of the electrical pan 7.

Moreover, in the above-described socket for electrical parts, it the contact end face 28*a* of the first contact pin 28 is formed as in FIG. 5 or FIG. 8, then even if the pressure force applied to the electrical part is low, since the electrical connection between the connection terminal 8 and the first contact pin 28 can be ensured reliably, it is possible to lower a working pressure of the socket cover of the socket for electrical parts compared with a conventional one. Thus, a pressing mechanism of testing equipment can be made small and simple.

What is claimed is:

1. A contact unit electrically connecting two connection objects using a connecting device arranged in a hole portion formed in at least one surface of an insulating member, wherein said connecting device comprises
    a contact which is pressed to engage a connection terminal of at least one of said two connection objects for electrical connection therewith;
    a stationary, cylindrical conductive member provided on an inner circumferential surface of said hole portion to electrically connect said contact with the other connection object; and
    a resilient member which urges said contact outwardly relative to said conductive member to protrude partially from said hole portion at an open end of said conductive member, said resilient member being deformed due to the urging of said contact to impart a rotational force on said contact around a contact point between said contact and said connection terminal connected therewith; and
    a retaining member connected with the insulating member around said open end of said conductive member for retaining said contact within said hole portion independent of said conductive member.

2. A contact unit according to claim 1, wherein said hole portion is a through hole which is formed so as to pass through said insulating member.

3. A contact unit according to claim 2, wherein said resilient member is arranged within said through hole, and urges a pair of contacts positioned on opposite ends thereof to partially protrude from both ends of said through hole.

4. A contact unit according to claim 1, wherein said hole portion comprises first and second holes each of which corresponds to a respective connection terminal or contact electrode provided on one of said two connection objects, each of said first and second holes containing said connecting device, respectively.

5. A contact unit according to claim 4, wherein said first and second holes are arranged in one surface of a multi-layer wiring board opposite one of said two connection objects, and a conductive members of connecting devices are arranged in said first and second holes, respectively, and connection terminals or contact electrodes of the other of said two connection objects, or conductive members of another hole portion provided independently at a remote location from said hole portion are connected by wiring paths formed in each layer of said multi-layer wiring board.

6. A contact unit according to claim 1, wherein said contact is formed with a cavity for receiving said connection terminal of said connection object in an end surface thereof at which said contact is in contact with said connection terminal, and at least one projection is provided on a rim of said cavity.

7. A contact unit according to claim 6, wherein an inside surface of said cavity is formed as an inclined surface inclined inwards from a rim thereof.

8. A contact unit electrically connecting two connection objects using a connecting device arranged in a hole portion formed in at least one surface of an insulating member,
    wherein said connecting device comprises
    a contact including a cavity in an end surface thereof for receiving and contacting a connection terminal of at least one of said two connection objects for electrical connection therewith, said cavity having a surface inclined inwardly from a rim thereof, at least one projection being provided on said cavity rim, said rim being formed with a guide surface whose slope is shallower than said inclined surface;
    a conductive member provided on an inner circumferential surface of said hole portion to electrically connect said contact with the other connection object;
    a resilient member which urges said contact outwardly to protrude partially from said hole portion at an open end, said resilient member being deformed due to the urging of said contact to impart a rotational force on said contact around a contact point between said contact and said connection terminal connected therewith; and
    a retaining member connected with the insulating member around said open end of said hole portion for retaining said contact therein.

9. A socket for electrical parts comprising:
    a mounting portion for detachably mounting an electrical part provided with a plurality of connection terminals arranged on a surface thereof; and
    a contact unit that electrically connects the connection terminals of said electrical part mounted on said mounting portion and contact electrodes of a circuit board facing said electrical part, using a connecting device housed in a hole portion formed in at least one surface of an insulating member, wherein said connecting device comprises;

a contact which is pressed to engage at least one of the connection terminals of said electrical part for electrical connection therewith;

a stationary, cylindrical conductive member provided on an inner circumferential surface of said hole portion to electrically connect said contact with said circuit board; and a resilient member which urges said contact outwardly relative to said conductive member to protrude partially from said hole portion at an open end of said conductive member, said resilient member being deformed due to the urging of the contact to impart a rotational force on said contact around a contact point between said contact and said connection terminal engaged therewith; and a retaining member connected with said insulating member around sand open end of said conductive member for retaining said contact within said hole portion independent of said conductive member.

10. A socket for electrical parts according to claim 9, wherein said contact is formed with a cavity for receiving the connection terminal of said connection abject, in an end surface thereof at which said contact is in contact with said connection terminal, and at least one projection is provided on a rim of said cavity.

11. A socket for electrical parts according to claim 10, wherein an inner surface of said cavity is formed as an inclined surface inclined inwards from a rim thereof.

12. A socket for electrical parts, comprising:

a mounting portion for detachably mounting an electrical part provided with a plurality of connection terminals arranged on a surface thereof; and a contact unit that electrically connects the connection terminals of said electrical part mounted on said mounting portion and contact electrodes of a circuit board facing said electrical part, using a connecting device housed in a hole portion formed in at least one surface of an insulating member, wherein said connecting device comprises;

a contact including a cavity in an end surface thereof for receiving and contacting at least one of the connection terminals of said electrical part for electrical connection therewith, said cavity having a surface inclined inwardly from a rim thereof, at least one projection being provided on said cavity rim, said rim being formed with a guide surface whose slope is shallower than said inclined surface;

a conductive member provided on an inner circumferential surface of said hole portion to electrically connect said contact with said circuit board;

a resilient member which urges said contact outwardly to protrude partially from said hole portion at an open end, said resilient member being deformed due to the urging of the contact to impart a rotational force on said contact around a contact point between said contact and said connection terminal engaged therewith; and a retaining member connected with said insulating member around said open end of said hole portion for retaining said contact therein.

13. A contact unit electrically connecting two connection objects using a connecting device arrange in a hole portion formed in at least one surface of an insulating member, wherein said connecting device comprises a contact which is pressed to engage a connection terminal of at least one of said connection objects for electrical connection therewith;

a conductive member provided on an inner circumferential surface of said hole portion to electrically connect said contact with the other connection object; and a resilient member for urging said contact outwardly to partially protrude from said hole portion, said resilient member being deformed due to the urging of said contact, said contact being formed with a cavity for receiving said connection terminal of said connection object in an end surface thereof where said contact engages said connection terminal and at least one projection is provided on a rim of said cavity;

an inner surface of said cavity being formed as a surface which is inclined inwardly from a rim thereof; and said rim being formed with a guide surface whose slope is shallower than said inclined surface.

\* \* \* \* \*